(12) United States Patent
Arvin et al.

(10) Patent No.: US 11,756,930 B2
(45) Date of Patent: Sep. 12, 2023

(54) HIGH BANDWIDTH MODULE

(71) Applicant: International Business Machines Corporation, Armonk, NY (US)

(72) Inventors: Charles Leon Arvin, Poughkeepsie, NY (US); Bhupender Singh, Fishkill, NY (US); Shidong Li, Hopewell Junction, NY (US); Chris Muzzy, Burlington, VT (US); Thomas Anthony Wassick, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/520,718

(22) Filed: Nov. 8, 2021

(65) Prior Publication Data

US 2022/0059499 A1 Feb. 24, 2022

Related U.S. Application Data

(62) Division of application No. 16/814,139, filed on Mar. 10, 2020, now Pat. No. 11,201,136.

(51) Int. Cl.
*H01L 25/065* (2023.01)
*H01L 23/31* (2006.01)
(Continued)

(52) U.S. Cl.
CPC .......... *H01L 25/0655* (2013.01); *H01L 21/56* (2013.01); *H01L 23/3121* (2013.01);
(Continued)

(58) Field of Classification Search
None
See application file for complete search history.

(56) References Cited

U.S. PATENT DOCUMENTS

| 5,319,725 A | 6/1994 | Buchmann et al. |
| 7,683,458 B2 | 3/2010 | Akram et al. |

(Continued)

FOREIGN PATENT DOCUMENTS

| CN | 102856279 | 1/2013 |
| WO | 2013184880 | 12/2013 |

OTHER PUBLICATIONS

Chen,Xiaowei; International Search Report, National Intellectual Property Administration,PRC,PCT/IB2021/051375, dated May 26, 2020, pp. 1-10.

(Continued)

*Primary Examiner* — Long Pham
(74) *Attorney, Agent, or Firm* — L. Jeffrey Kelly; Otterstedt & Kammer PLLC

(57) ABSTRACT

A module includes a substrate having a plurality of contact regions, and a spacer-chip assembly. The spacer-chip assembly in turn includes at least first and second semiconductor dies, each having a plurality of electrical interconnect pillars and a plurality of contact pads, and a spacer wafer. The at least first and second semiconductor dies are secured to the spacer wafer, and the spacer wafer includes at least first and second semiconductor circuit features coupled to a first portion of the contact pads of the at least first and second semiconductor dies. The spacer wafer includes wiring electrically coupling the at least first and second semiconductor dies via a second portion of the contact pads. The spacer wafer has a plurality of holes formed therethrough. The plurality of electrical interconnect pillars extend through the holes and are secured to the contact regions on the substrate.

11 Claims, 12 Drawing Sheets

(51) Int. Cl.
*H01L 23/538* (2006.01)
*H01L 23/00* (2006.01)
*H01L 25/00* (2006.01)
*H01L 21/56* (2006.01)
*H01L 23/64* (2006.01)

(52) U.S. Cl.
CPC ........ *H01L 23/5386* (2013.01); *H01L 23/642* (2013.01); *H01L 24/13* (2013.01); *H01L 25/50* (2013.01); *H01L 2224/13147* (2013.01)

(56) References Cited

U.S. PATENT DOCUMENTS

| | | |
|---|---|---|
| 8,426,244 B2 | 4/2013 | Hollis |
| 9,059,179 B2 | 6/2015 | Karikalan et al. |
| 10,347,548 B2 | 7/2019 | Chen et al. |
| 2003/0122229 A1 | 7/2003 | Bakir et al. |
| 2011/0294237 A1 | 12/2011 | Chang |
| 2014/0048906 A1 | 2/2014 | Shim et al. |
| 2015/0255415 A1 | 9/2015 | DeBonis et al. |
| 2017/0011948 A1 | 1/2017 | Farrens et al. |
| 2018/0061778 A1 | 3/2018 | Li |
| 2018/0122710 A1 | 5/2018 | Cheng et al. |
| 2018/0156865 A1 | 6/2018 | Chen et al. |
| 2020/0312812 A1 | 10/2020 | Arvin |
| 2021/0288025 A1 | 9/2021 | Arvin |

OTHER PUBLICATIONS

Paul J. Otterstedt, List of IBM Patents or Patent Applications Treated as Related, 2 Pages, Nov. 8, 2021.

Bargiel et al., Technological Platform for Vertical Multi-Wafer Integration of Microscanners and Micro-Optical Components. Micromachines, 10(3), 185, 22 Pages, 2019.

Laakso et al., Through-Glass vias for Glass Interposers and MEMS Packaging Applications Fabricated Using Magnetic Assembly of Microscale Metal Wires. IEEE Access, 6, 44306-44317, 2018.

Keyvaninia et al., Ultra-thin DVS-BCB adhesive bonding of III-V wafers, dies and multiple dies to a patterned silicon-on-insulator substrate. Optical Materials Express, 3(1), 35-46, 2013.

Heterogeneous Integration Roadmap, 2019 Edition, Chapter 1: HIR Overview and Executive Summary, 16 pages.

Heterogeneous Integration Roadmap, 2019 Edition, Chapter 8: Single Chip and Multi-Chip Integration, 65 pages.

Heterogeneous Integration Roadmap, 2019 Edition, Chapter 22: Interconnects for 2D and 3D Architectures, 11 pages.

Arvin et al., unpublished U.S. Appl. No. 16/369,532, filed Mar. 29, 2019, Spacer for Die-To-Die Communication in an Integrated Circuit, pp. 1-17 plus 7 sheets of drawings.

IP Australia, Notice of acceptance for patent application. Counterpart Australian Application No. 2021235527, dated Jun. 2, 2023. pp. 3.

R Ramya Rao, K&S Partners, Office Action Response in counterpart Indian Patent Application No. 202247045491 dated May 12, 2023. pp. 36.

HIGH BANDWIDTH MODULE

CROSS-REFERENCE TO RELATED APPLICATION

This application is a division of U.S. patent application Ser. No. 16/814,139 filed 03-10-2020, the complete disclosure of which is expressly incorporated herein by reference in its entirety for all purposes.

BACKGROUND

The present invention relates to the electrical, electronic, and computer arts, and more specifically, to communications between semiconductor dies and the like.

Semiconductor dies have continued to become more complex and grow in size. The defect density on the wafer leads to these larger dies having a greater chance to be impacted by random defects, and thus a lower yield. In order to reduce yield loss, the dies are being split in size—but now need to have greater amount of input/output (I/O) to communicate between chips at fast enough rates.

Applications in artificial intelligence (AI), for example, require high power, and signal integrity becomes more of an issue. These power and signal integrity aspects put more demands on solving thermal issues specifically related to thermal interface degradation and uniform bond lines. This is exacerbated by having multiple dies and multiple types of dies on a single module.

SUMMARY

Principles of the invention provide techniques for a high bandwidth module structure and process to make same. In one aspect, an exemplary module includes a substrate having a plurality of contact regions; and a spacer-chip assembly. The spacer-chip assembly in turn includes at least first and second semiconductor dies, each having a plurality of electrical interconnect pillars and a plurality of contact pads; and a spacer wafer. The at least first and second semiconductor dies are secured to the spacer wafer, and the spacer wafer includes at least first and second semiconductor circuit features coupled to a first portion of the contact pads of the at least first and second semiconductor dies. The spacer wafer includes wiring electrically coupling the at least first and second semiconductor dies via a second portion of the contact pads. The spacer wafer has a plurality of holes formed therethrough. The plurality of electrical interconnect pillars extend through the holes and are secured to the contact regions on the substrate.

In another aspect, an exemplary method includes providing a spacer wafer, which has inner and outer surfaces. the spacer wafer includes at least first and second semiconductor circuit features and wiring, adjacent the outer surface. Further steps include forming a plurality of trenches partially through the spacer wafer, spaced from the at least first and second semiconductor circuit features and the wiring; providing first and second semiconductor dies, each having a plurality of electrical interconnect pillars and a plurality of contact pads, the electrical interconnect pillars having distal ends; and securing the first and second semiconductor dies to the spacer wafer via the plurality of contact pads with the interconnect pillars extending into the trenches, and with the contact pads coupled to the wiring and the semiconductor circuit features, to form a spacer-chip assembly. Yet further steps include processing the inner surface of the of the spacer wafer to open the trenches and expose the distal ends of the pillars; applying electrically conductive connective material to the distal ends of the pillars; and securing the spacer-chip assembly to a substrate via the electrically conductive connective material on the distal ends of the pillars.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Techniques of the present invention can provide substantial beneficial technical effects. For example, one or more embodiments provide one or more of:

enables direct connection between the processor die and bottom substrate which is beneficial for high power applications;

enables direct attach of the signals to the substrate without being in contact with the Si—this avoids the cross talk between signals that can occur with TSV (Through Silicon Vias);

reduces or eliminates height differential among the various dies;

enables modules with an essentially unlimited number of dies;

reduces or eliminates shorting concerns during the chip joining operation;

permits multiple overhangs and a combination of large windows and individual holes for each controlled collapse chip connection (C4);

ability to support die(s) that cantilever(s) beyond the substrate or that is/are larger than the substrate but with support at all corners;

enables addition of glass for high thermal chips on same substrate and for addition of microchannels or waveguides.

These and other features and advantages of the present invention will become apparent from the following detailed description of illustrative embodiments thereof, which is to be read in connection with the accompanying drawings.

DETAILED DESCRIPTION

Figure 1:
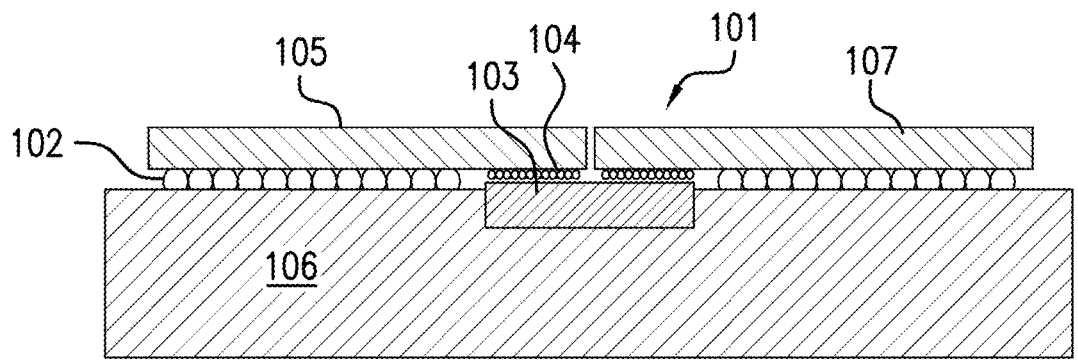
FIG. 1 shows a first high bandwidth module design, according to the prior art.

As noted, semiconductor dies have continued to become more complex and grow in size. The defect density on the wafer leads to these larger dies having a greater chance to be impacted by random defects, and thus a lower yield. In order to reduce yield loss, the dies are being split in size—but now need to have greater amount of input/output (I/O) to communicate between chips at fast enough rates.

Applications in artificial intelligence (AI), for example, require high power, and signal integrity becomes more of an issue. These power and signal integrity aspects put more demands on solving thermal issues specifically related to thermal interface degradation and uniform bond lines. This is exacerbated by having multiple dies and multiple types of dies on a single module.

In order to enable fast communication between dies, wiring dimensions that are achievable in the semiconductor fabrication process are helpful. Silicon (Si) bridges have been attempted in the past, yet these have led to significant challenges in assembly. Si interposers have been evaluated. The through silicon vias (TSVs) used in such interposers impact signal integrity and power delivery. They also pose challenges for sourcing as a stand-alone component. The Si interposer leads to supply chain availability issues and also has bond and assembly challenges.

One or more embodiments advantageously provide a structure that allows communication across an entity that has silicon-based wiring between dies, but without the need for TSV or dual-sided plating. One or more embodiments provide a communication-style structure in what will eventually be a large Si or glass feature approaching the area taken up on the laminate of multiple dies (refer to discussion of FIG. 20 below). Instead of creating a Si or glass interposer with TSV, only the communication feature(s) and bumping of those regions with capture pads occur.

In one or more embodiments, the large Si entity is first formed at the wafer level to have high density regions with high bandwidth communication between closely spaced dies. The wafer is then patterned with micro-bumps for the communication between dies and also as anchorage points to connect die(s) to the wafer. Prior to die attachment to the wafer, holes are formed to allow large pillars on the die to pass through. Dies are then attached to the wafer followed by underfill of each die.

The wafer is then over-molded to encapsulate all dies to the wafer. At this point, the wafer is ground on the top to reduce the thickness of the die/over-mold to circa 400 μm or less from the wafer surface. The wafer is then partially diced to along what will be the final substrate (refer to discussion of FIG. 15 below). At this point, the wafer is flipped over and the wafer is ground, followed by chemical-mechanical polishing (CMP) and ash to reveal the Cu pillars and singulate the entity at the same time.

There are multiple embodiments and alterations that can occur. For example, if the substrate is Si, then MIM (Metal-Insulator-Metal) capacitors or Deep Trench (DT) capacitors can be added to provide decoupling solutions for the wafer core, which can address frequency noise in the 1 to 10 GHz range. If the substrate is glass, then thin film capacitors can be added first, followed by the patterning, to create the high-density communication paths between chips. It is also possible to add islands of glass into a Si substrate first, in order to have thermally isolated regions if there is a desire to combine SiC die technology and Si technology onto the same substrate. These glass regions can also include microchannels for cooling within the package or waveguides for optical or photonic applications. It is also possible to carry out dicing after grinding and to have C4 bumping on the tip of the Cu pillars after they are exposed.

Figure 2:
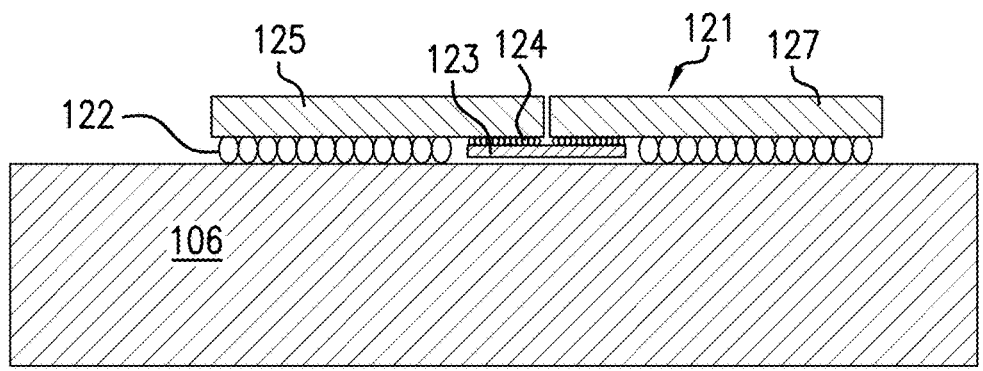
FIG. 2 shows a second high bandwidth module design, according to the prior art.
Figure 3:
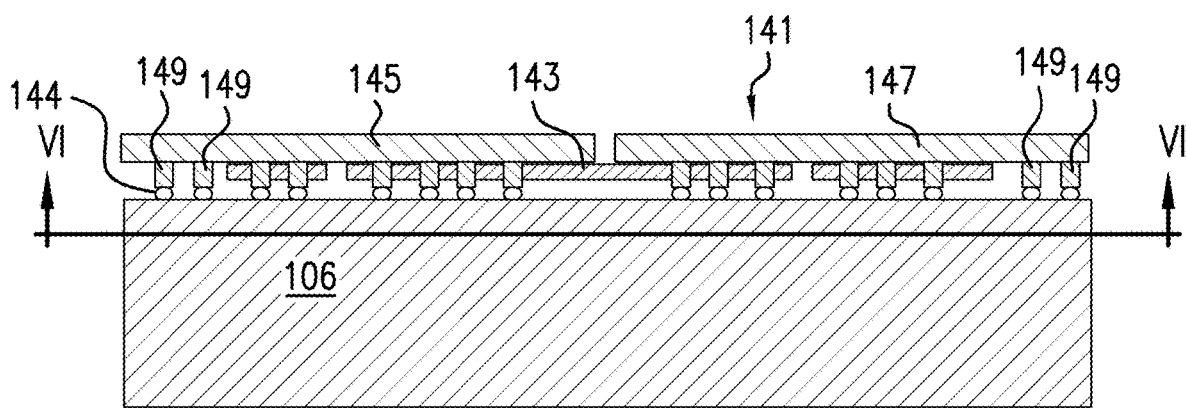
FIG. 3 shows a third high bandwidth module design, according to the prior art.

FIGS. 1-3 show a number of possible prior-art high bandwidth module designs. FIG. 1 shows a design 101 with an embedded bridge 103 (embedded in substrate 106). Advantageously, no special handling of the dies is required. However, it is difficult to use more than two dies; trench lamination is required; a source is required for the laminate; it is possible to lose available wiring space between the dies and around the trench; cost increases by about 2× for the laminate; and large C4s can pull the dies 105, 107 off the bridge region 103, resulting in very low yield. When trenching 103 into the laminate 106, the trenched area and the area around the trench cannot be used for Cu wiring due to referencing needs and the physical loss of space which is even larger than the bridge itself. Cu wires are typically about 15 μm in thickness while vias are typically 25-30 μm in thickness. Bridge 103 may be about 300-400 μm in thickness resulting in loss of available wiring area. Note large solder balls 102 and small solder balls 104.

FIG. 2 shows a design 121 with an external bridge 123. Advantageously, a standard laminate can be employed, the design ensures that the dies 125, 127 are properly connected to the bridge, all components can be readily sourced, and the design maintains the full ability to wire under the bridge shadow. However, it is difficult to use more than two dies; handling may break the bridge; special fixtures are needed; and it may be necessary to plate the Cu pillars on the die to increase the gap. Note large solder balls 122 and small solder balls 124.

FIG. 3 shows a design 141 with a spacer 143. Advantageously, a standard laminate can be employed, the design ensures that the dies 145, 147 are properly connected to the spacer, all components can be readily sourced, the design maintains the full ability to wire everywhere, and it is possible to have four or more dies with no issues. However, plating of 150 to 200 μm thick Cu pillars 149 is typically required (only some pillars are numbered, to avoid clutter). Note also solder balls 144.

Figure 4:
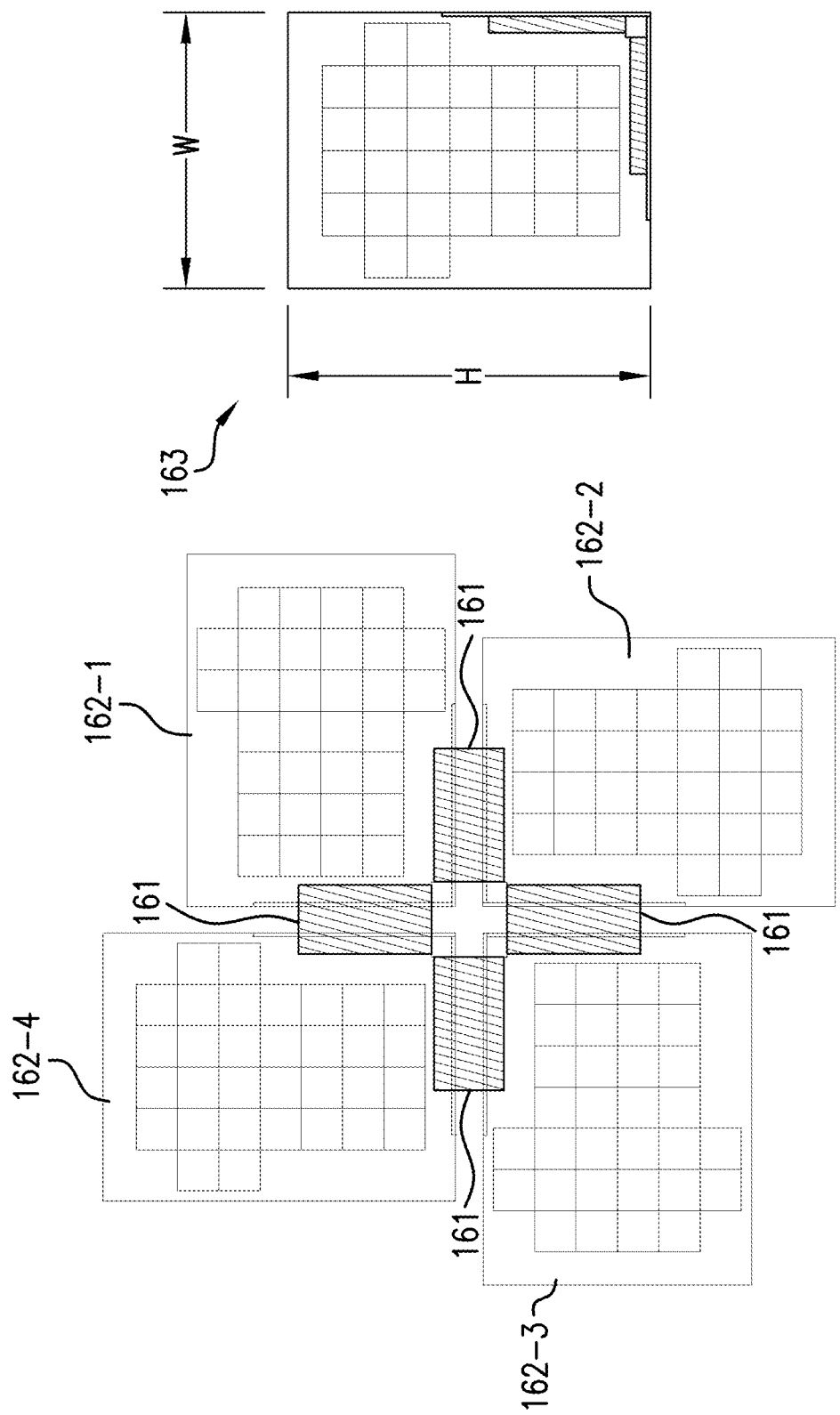
FIG. 4 illustrates complexities of bridge technologies when used with multi-chip modules (MCM)

Referring to FIG. 4, the need to align and utilize multiple thin bridges 161 with high bond and assembly (BA) yield adds complexity. An appropriate BA process will be such that no issues are encountered from putting everything together; desirably, a process should be employed that has final yields of at least 98%. The alignment process itself could lead to a loss of 1% during BA. The process of aligning and flipping over can have another 1% fallout. If there is any issue along the way, it can lead to another 5 to 10% fall out due to non-wets and bad electrical responses. The situation in FIG. 4 may also limit the available thermal solutions as permanent carriers may be required. Note dies 162-1, 162-2, 162-3, and 162-4. View 163 is a detail of die 162-4. In a non-limiting example, width W is 19,500 μm and height H is 25,600 μm. The bridge footprints are shown at 165; their long dimension can be, for example, 9626 μm.

Figure 5:
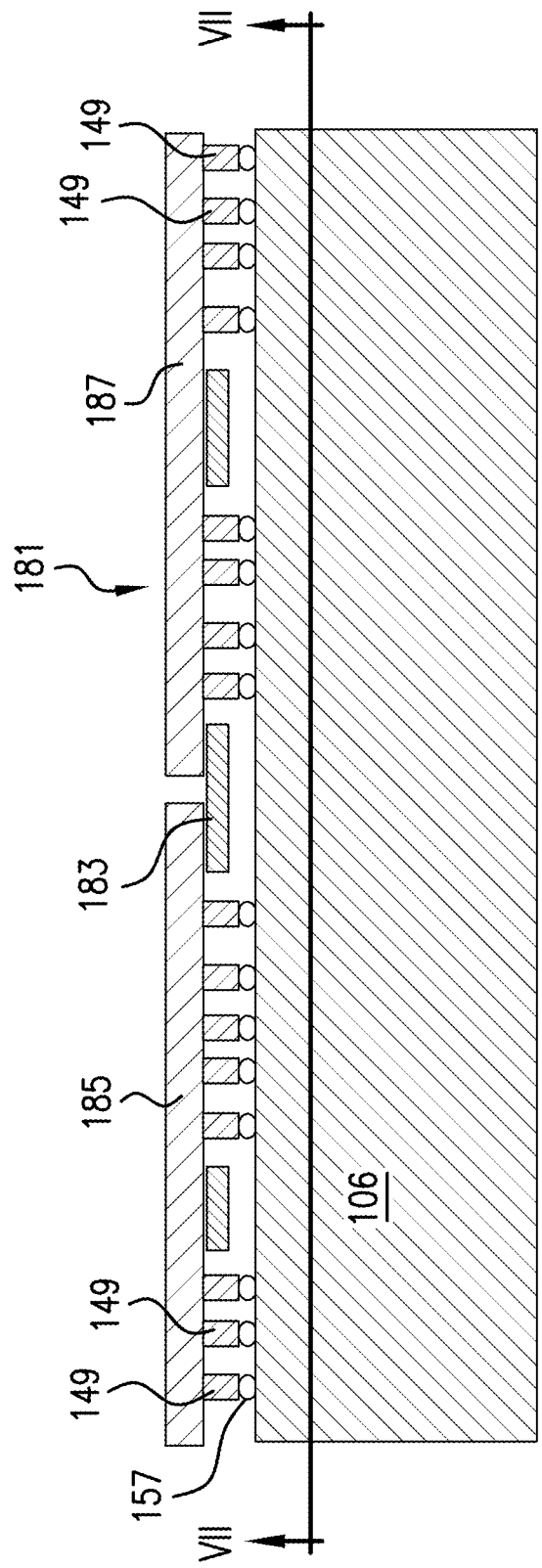
FIG. 5 shows a multi-chip module design with a spacer.

FIG. 5 shows a design 181 with a spacer 183. Advantageously, a standard laminate can be employed, the design ensures that the dies 185, 187 are properly connected to the spacer, all components can be readily sourced, the design maintains the full ability to wire everywhere, and the design enables all dies to be physically attached and ease handling. Furthermore, it is possible to have four or more dies with no issues, alignment tolerance issues with holes are reduced or eliminated, it is possible to deliver larger C4s for power and ground and smaller C4s for signal, and high aspect photoresist plating needs are reduced. However, plating of 150 to 200 μm thick Cu pillars 149 is typically required, and some modification of the dies may be needed as compared to the configuration in FIG. 3. Note also solder balls 157.

Figure 6:
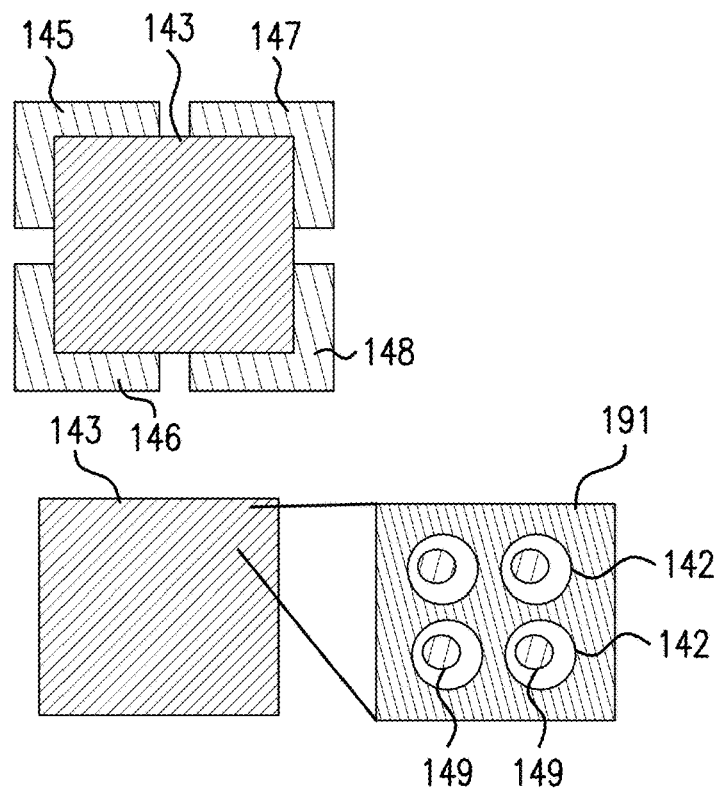
FIG. 6 shows a view of the spacer of the design of FIG. 3.

FIG. 6 shows, at the top, a view of the spacer 143 of the design 141 of FIG. 3, in relation to dies 145, 147, 146, 148. The view is looking "up" in FIG. 3 with substrate 106 omitted (see section line VI-VI). The bottom of FIG. 6 shows a detail 191 of the spacer 143 including holes 142 to accommodate pillars 149. Such a design might include, for example, 15,000 holes; 80 μm Cu pillars in the under bump metallurgy (UBM); and holes of about 100 μm diameter. Advantageously, there is no impact on the die design. However, sidewall passivation is important and the approach is limited by the resolution of the photoresist process.

Figure 7:
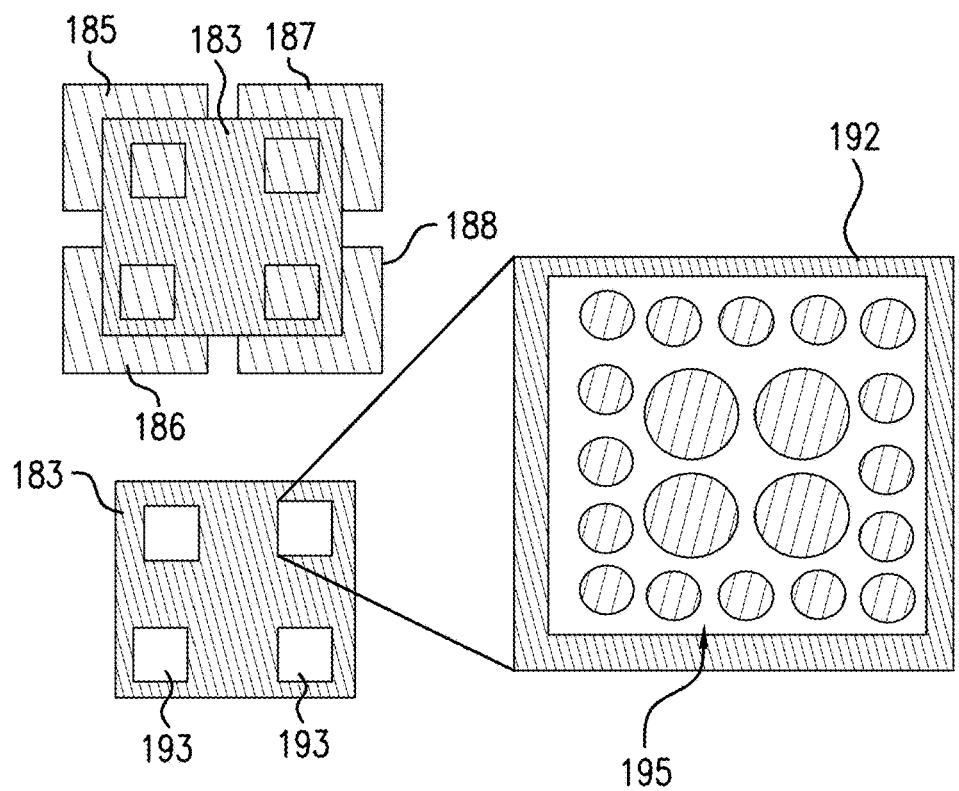
FIG. 7 shows a view of the spacer of the design of FIG. 5.

FIG. 7 shows, at the top, a view of the spacer 183 of the design 181 of FIG. 5, in relation to dies 185, 187, 186, 188. The view is looking "up" in FIG. 5 with substrate 106 omitted (see section line VII-VII). The bottom of FIG. 7 shows a detail 192 of the spacer 183 including large (relative to FIG. 6) UBM 195 suitable for AI applications. Such a design might include, for example, four large holes; 100+μm Cu pillars in the under bump metallurgy (UBM); and square holes of about 900 μm per side. Advantageously, sidewall passivation is not as important and the approach is not limited by the resolution of the photoresist process. Furthermore, mixed UBM is possible, enabling higher power support. On the other hand, die design is impacted.

Figure 8:
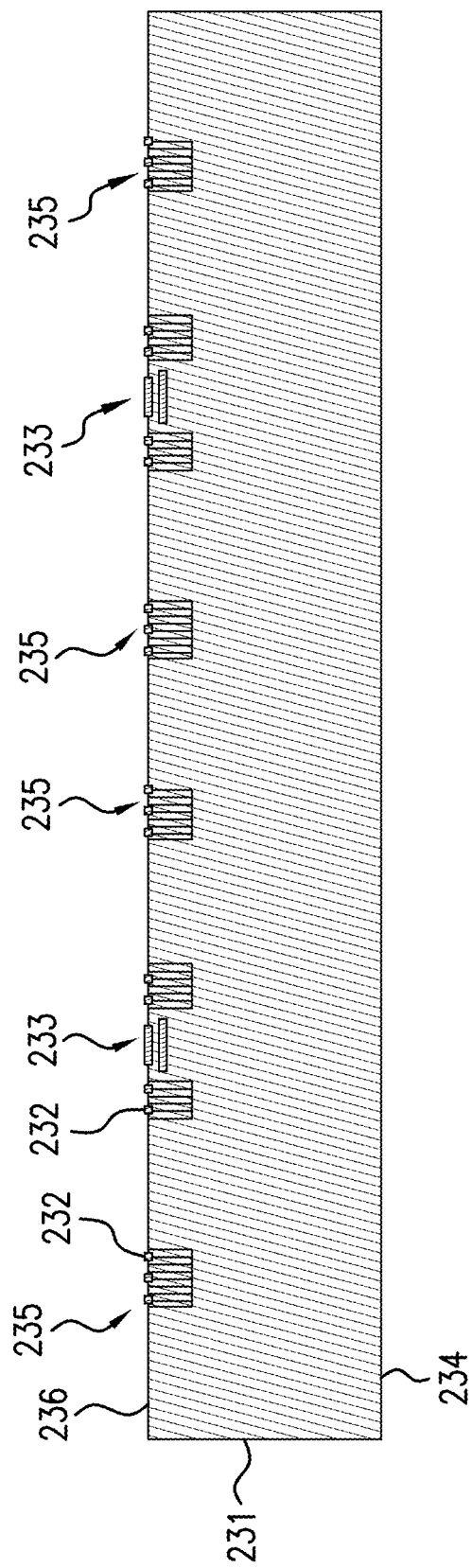
FIGS. 8-19 show steps in an exemplary manufacturing process, according to an aspect of the invention.
Figure 9:
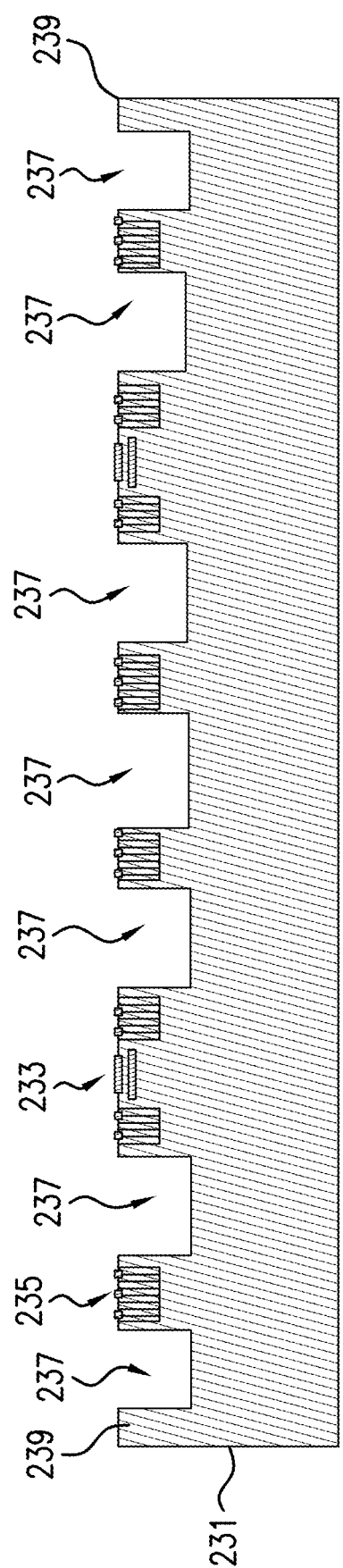
Figure 10:
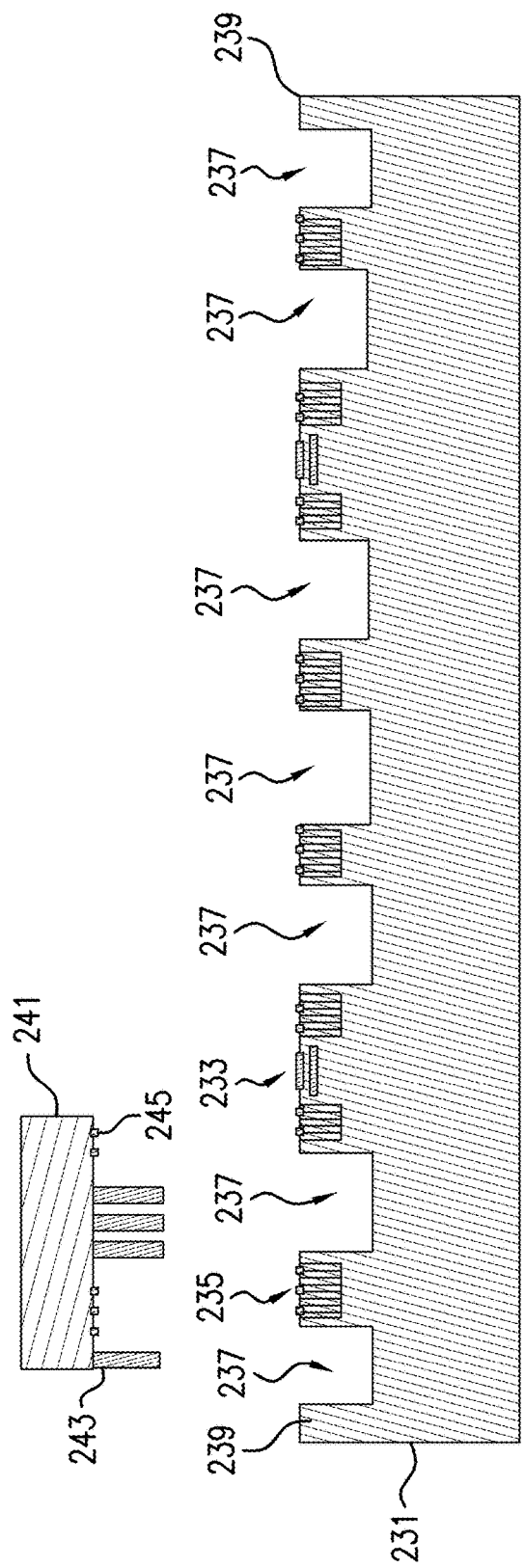
Figure 11:
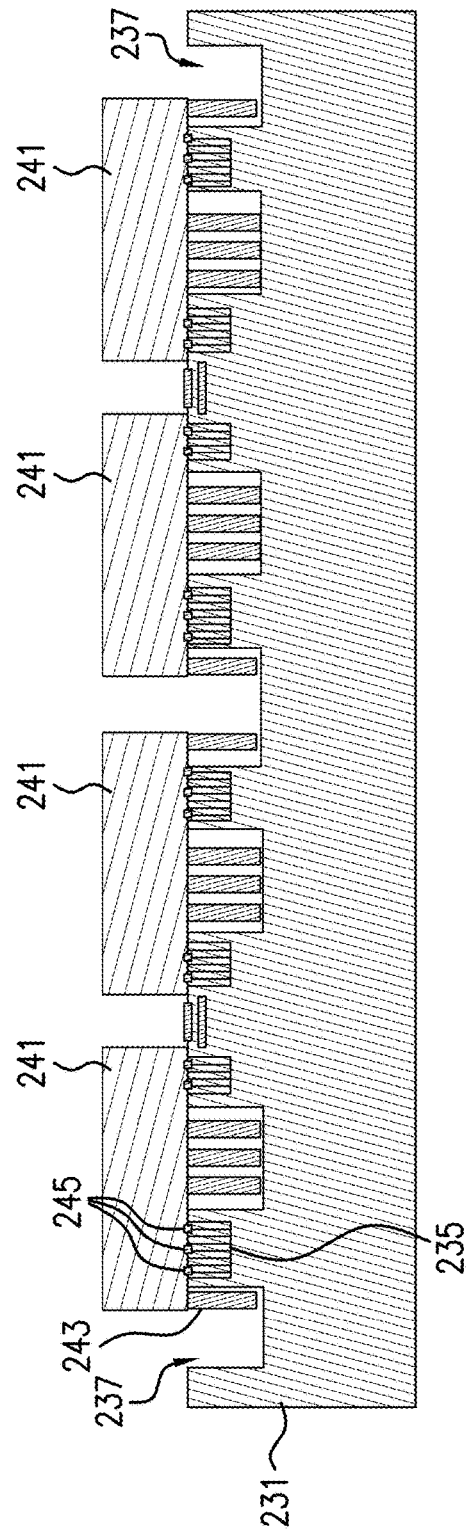
Figure 12:
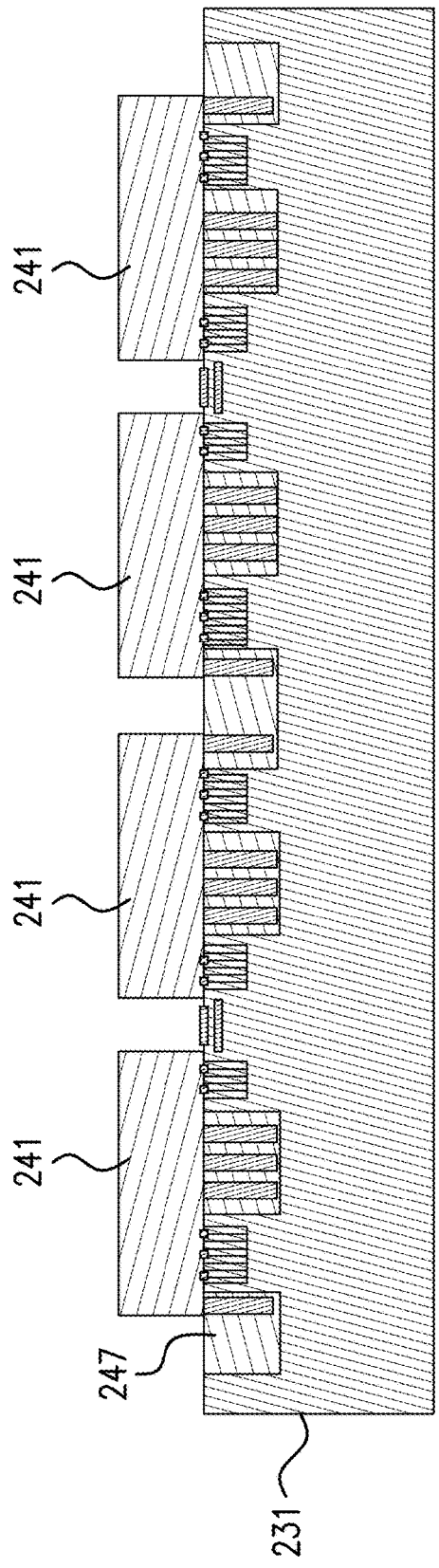
Figure 13:
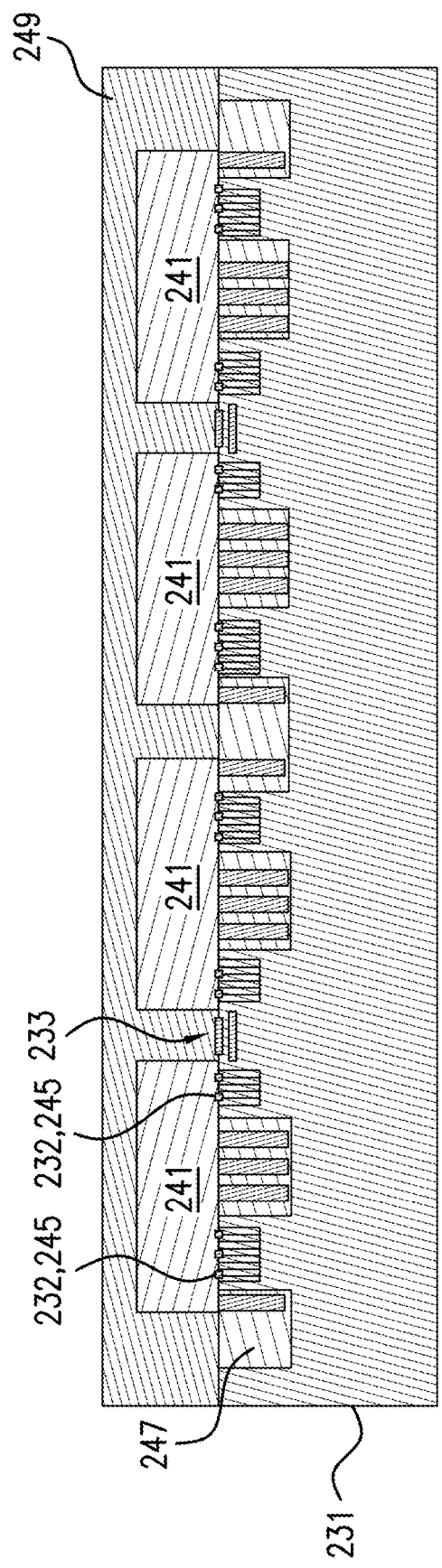

Consider now a spacer using heterogeneous integration (HI). HI refers to the assembly and packaging of multiple separately manufactured components onto a single chip in order to improve functionality and enhance operating characteristics. Heterogeneous integration allows for the packaging of components of different functionalities, different process technologies, and sometimes separate manufacturers. The combined devices can vary in functionality (e.g., processors, signal processors, cache, sensors, photonics, RF, and MEMS) and technologies (e.g., one optimized for die size with another one optimized for low power). Referring to FIG. 8, note wafer 231 from which one or more spacers are to be fabricated. The wafer can be, for example, 6 inches, 8 inches, or 12 inches in diameter (respectively 15, 20, or 30 centimeters). Note also high density wiring 233, contacts 232, and capacitor 235 which can be, for example, 35 μm thick. In FIG. 9, pattern and ash (using, e.g., standard lithography and ashing processes) to produce holes 237 which can be, for example, 80 μm deep. As seen at 239, in one or more embodiments, maintain the wafer edge at full thickness. In FIG. 10, two-pass plate one or more dies 241 with 100 μm Cu pillars 243 and pads 245. It should be noted that specific dimensions provided herein are exemplary and other embodiments can have different dimensions. In FIG. 11, join one or more chips 241 to the wafer 231. Pillars 243 are placed within holes 237 while pads 245 engage with caps 235. In FIG. 12, apply underfill 247 into the holes 237 (holes not numbered in FIG. 13 to avoid clutter). In FIG. 13, apply over-mold 249. The wiring 233 can be made, for example, using dual damascene technology; e.g., within oxide which has a cap of nitride over them. The pads 232 can be formed, for example, by opening only the nitride under the pads. The pads 232 are joined to the pads 245 (depicted as single entities after joining). A variety of conventional underfill and over-mold materials can be employed.

Figure 14:
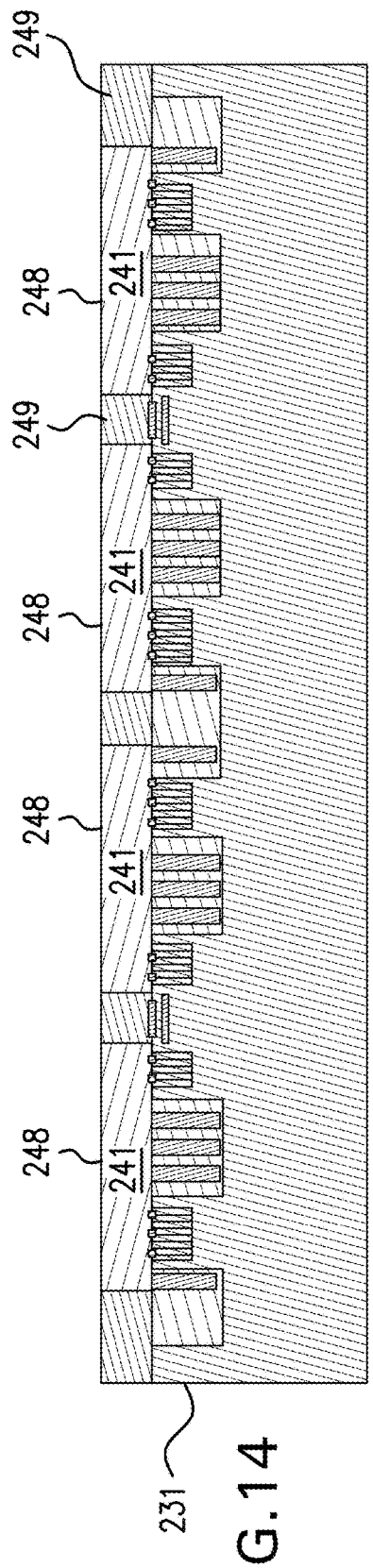
Figure 15:
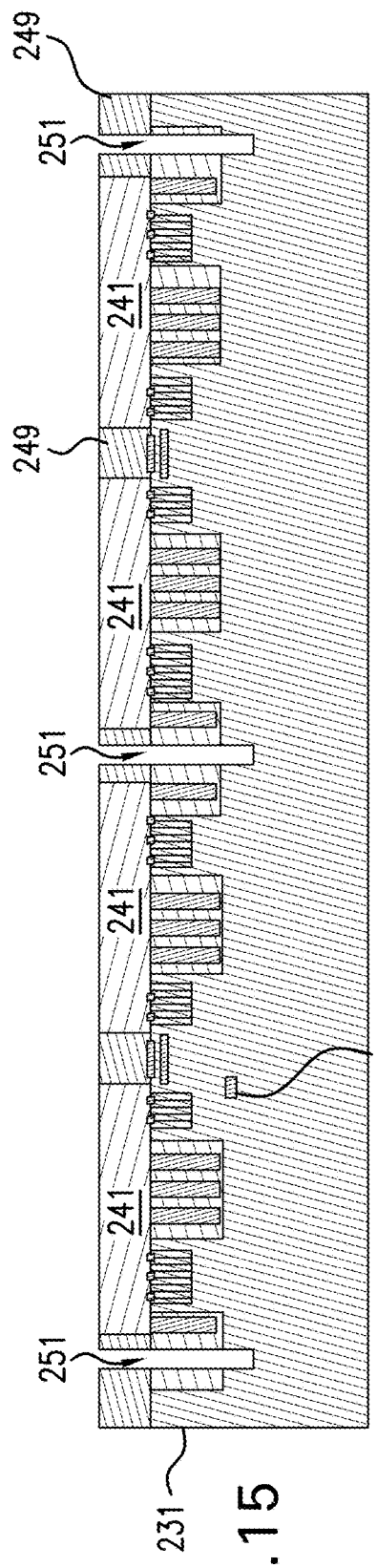
Figure 16:
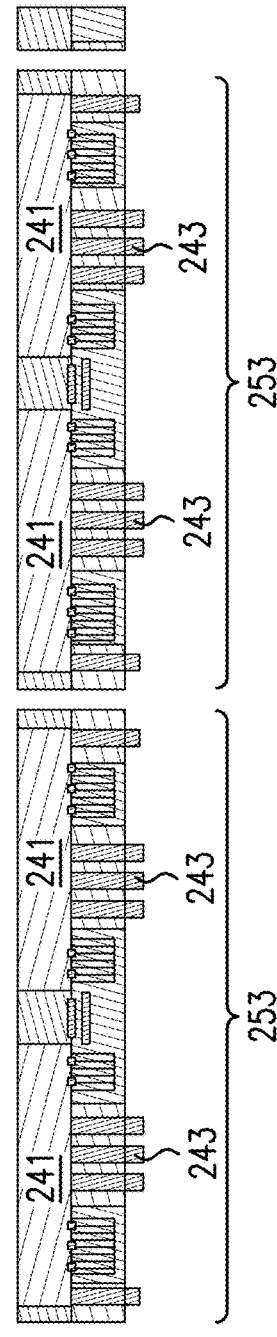
Figure 17:
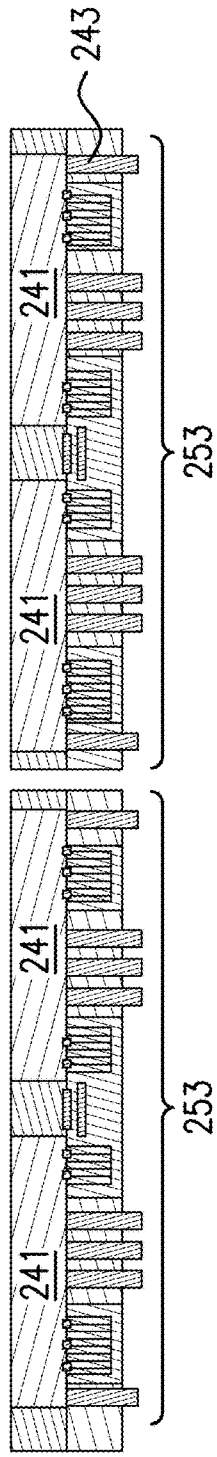
Figure 18:
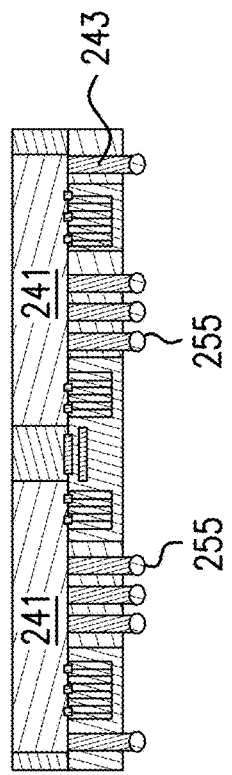
Figure 19:
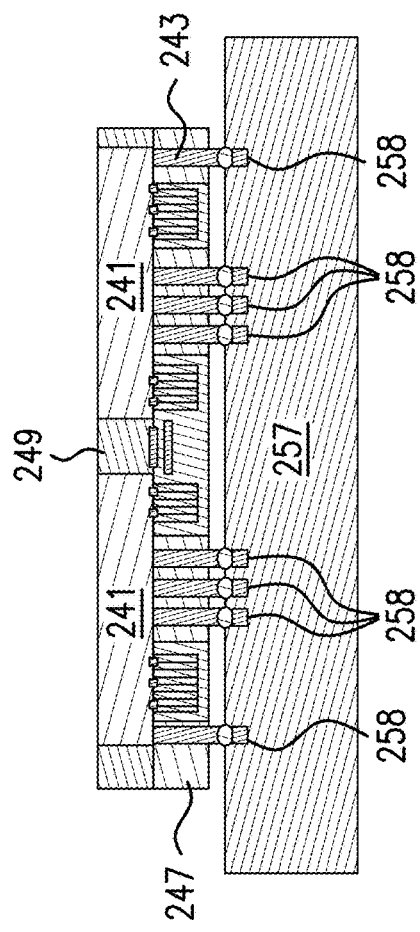
Figure 20:
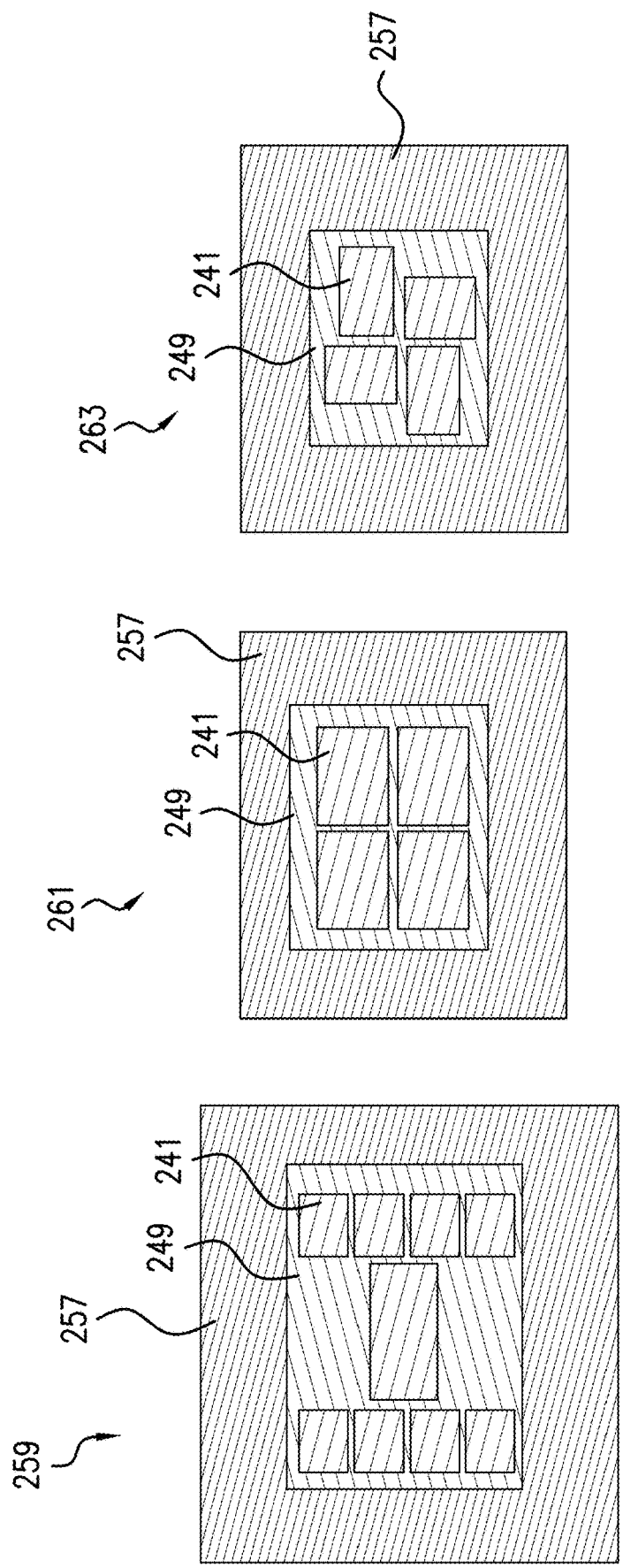
FIG. 20 shows alternative arrangements of possible top views of FIG. 19.

In FIG. 14, grind the upper surface so that the over-mold is now only present between the dies 241 and at the outboard edges. In FIG. 15 ("dice before grind" process), partially dice (e.g., via standard mechanical dicing processes, optionally with the use of a laser), as seen at 251. In FIG. 16, (backwards) grind the lower surface and carry out chemical-mechanical polishing (CMP) and ashing to separate into individual spacer/chip assemblies 253 (see resulting singulation in FIG. 17) and expose lower ends of the pillars 243. FIG. 17 shows the singulated spacer/chip assemblies 253. In FIG. 18 apply dippable paste 255 to the lower ends of the pillars 243. In FIG. 19, attach to the substrate 257 via the dippable paste 255 on the lower ends of the pillars 243 (not numbered in FIG. 20 to avoid clutter). FIG. 20 shows alternative plan views 259, 261, 263 with different arrangements of dies 241. Note that over-mold 249 (essentially the outline, viewed in plan, of the spacer-chip assembly as discussed elsewhere herein) is larger in outline than the dies 241 themselves. In comparison, prior-art silicon bridge approaches have a small bridge entity between the dies much smaller in outline than the dies themselves. Prior-art silicon interposer designs may have a similar size as the embodiments shown in FIG. 20, but require through-silicon vias (TSVs) which are prone to signal cross-talk, are too small to carry significant power, and undesirably require power redistribution within the silicon. Furthermore, one or more embodiments enable the use of dippable paste instead of C4 plating, which has significant cost benefits. It should be noted that in some instances, the pillars 243 need not be provided with dippable paste or C4; rather, all the solder is provided on the substrate 257. However, this raises challenges regarding appropriate compatible flux materials (able to remove both copper oxides and oxides of the solder material) or use of a formic acid environment. Viewed in plan (i.e. looking down in FIG. 19), the interconnects 243 may take up, for example, 30% of the planform area, with the balance (70%) of the planform area filled with underfill 247. However, due to surface tension, the underfill may not be able to permeate gaps smaller than about 20 μm. We have found that a gap of about 60 μm is appropriate in one or more embodiments. For example, in FIG. 16, pillars 243 may protrude about 60 μm out from the surface. When making pillars 243 with photoresist, about a 4:1 aspect ratio (length: diameter) may be the largest attainable. This effectively limits the minimum diameter of the pillars. Dippable copper paste is used in some embodiments. Lead-free dippable solder pastes are employed in one or more embodiments, such as SnBi paste, tin-silver-copper (SAC) dippable paste, and the like. One suitable source of pastes is Dycotec Materials Ltd., Swindon, Wiltshire, SN5 7SW England. We have found that copper bonds can be brittle while solder is better able to tolerate coefficient of thermal expansion (CTE) mismatch.

It is worth noting that in some embodiments, plasma dicing is carried out before grinding to make curved edges.

Figure 21:
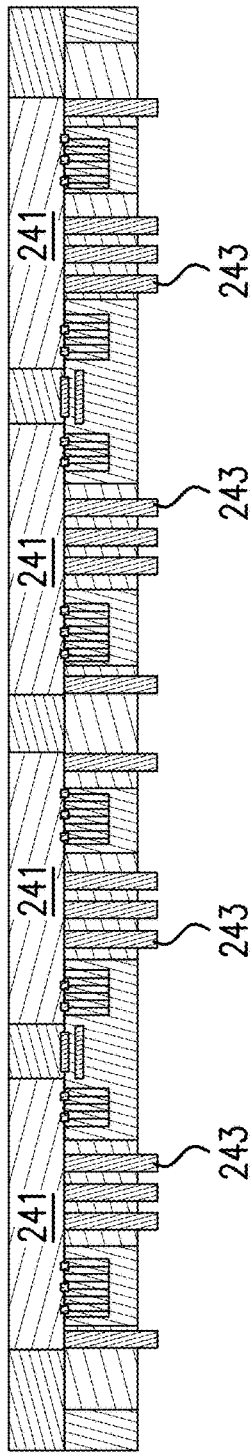
FIGS. 21-23 show alternative steps in an exemplary manufacturing process, according to an aspect of the invention.
Figure 22:
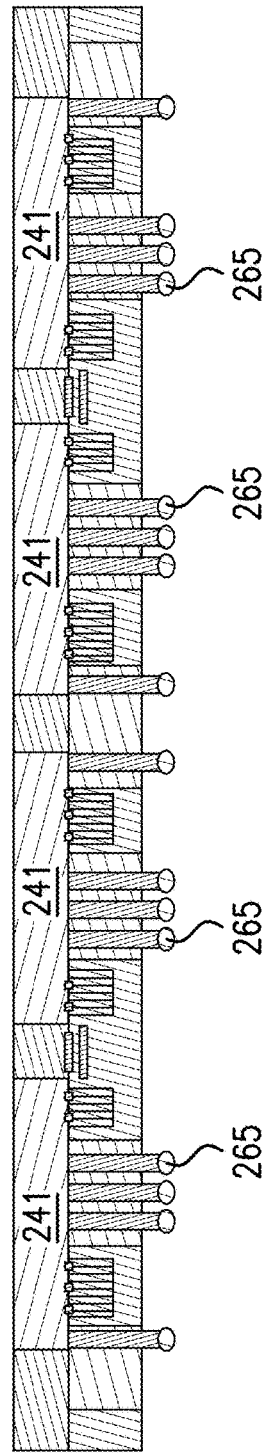
Figure 23:
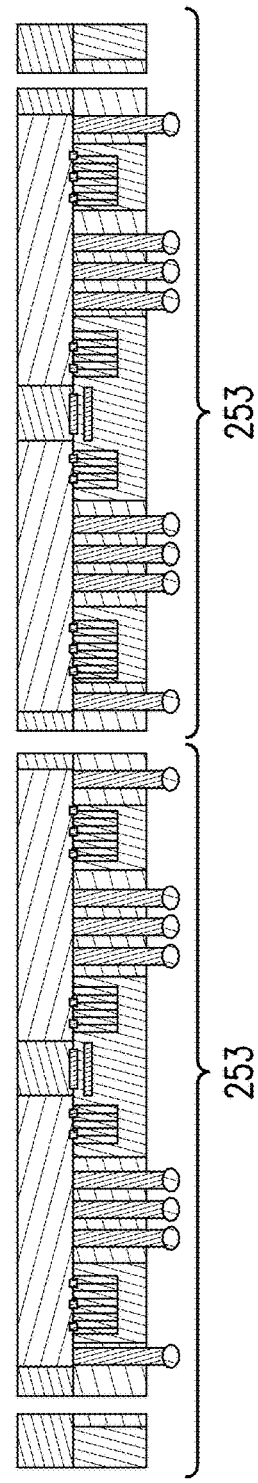

Referring to FIG. 21, in an alternative approach, grind the lower surface and carry out chemical-mechanical polishing (CMP) and ashing, without dicing, to expose lower ends of the pillars 243. In FIG. 22, carry out C4 plating to obtain solder dots 265 on the ends of the pillars (pillars not numbered in FIG. 22 to avoid clutter). Singulation is then carried out in FIG. 23 to obtain individual spacer/chip assemblies 253. Conventional C4 material can be used in one or more embodiments. Unlike a stand-alone interposer that is 100 μm thin which requires a carrier to handle, one or more spacer embodiments disclosed herein have a thickness of the die plus spacer; for example, about 500 μm thick after revealing the Cu pillars for plating. This advantageously eliminates the need for a carrier and subsequent release layer.

In an alternative approach, passivation can be carried out prior to removing the resist utilized in the ashing process; for example, via nitride or oxide deposition, especially if holes are to be added instead of windows.

Figure 24:
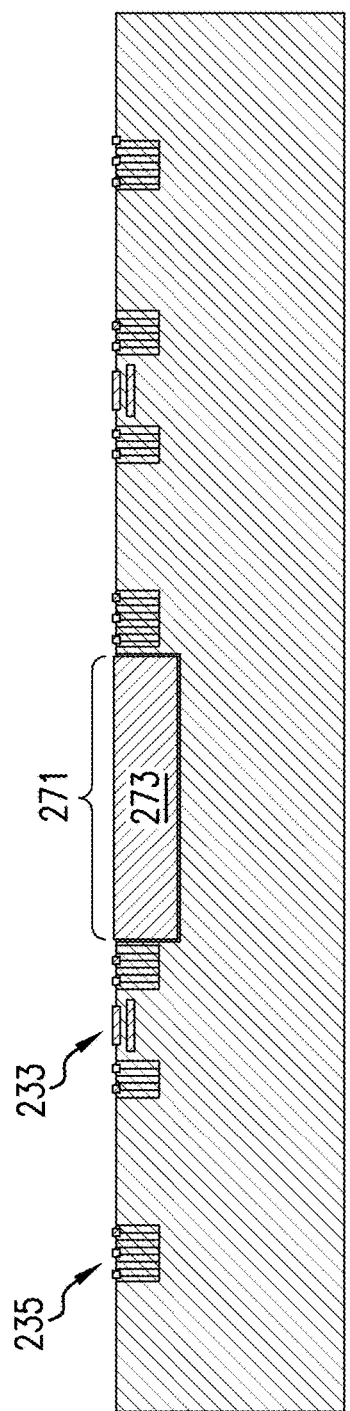
FIGS. 24-26 show alternative steps in an exemplary manufacturing process, according to an aspect of the invention, using glass to permit high heat flux SiC chips.
Figure 25:
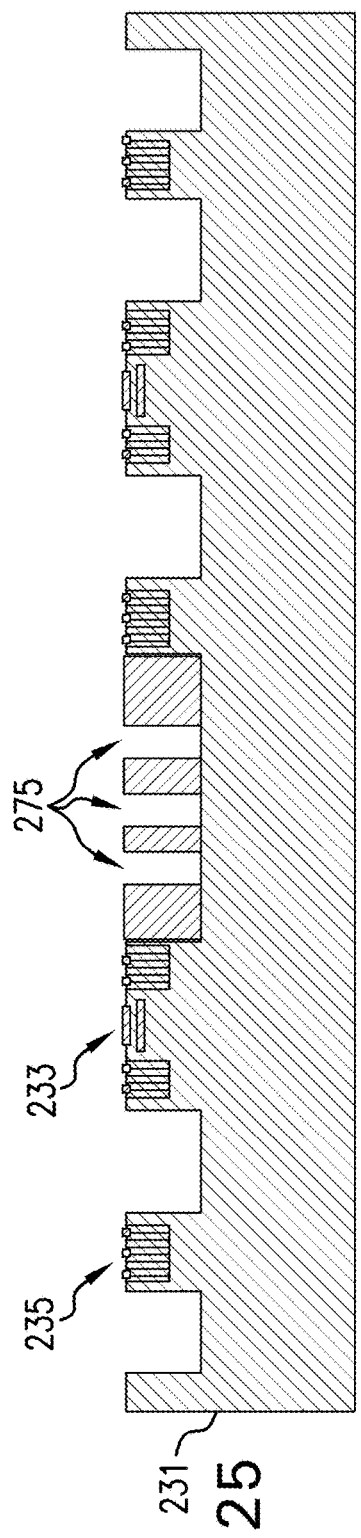

Referring to FIG. 24, in an alternative approach, ash a pocket 271 and add glass 273 with permanent adhesive prior to micro-bumping. In FIG. 25, plasma ash the glass 273 (not numbered in FIG. 33) to form holes 275. In FIG. 26, attach one or more SiC chips 277-2 with Cu pillars 279 located on the holes 275; an Si chip 277-1 can be attached, for example, via pillars through the other holes formed as described above (holes not labeled in FIG. 26 to avoid clutter). Thus, for example, first chip 277-1 can be a silicon chip and second chip 277-2 can be an SiC chip. Any suitable type of glass or adhesive known in the art can be used; glasses having a coefficient of thermal expansion (CTE) similar to that of Si are advisable in one or more embodiments. An epoxy can be used to avoid the needs of fillers and since these will have comparable CTEs.

Substrates (base carriers on which one or more embodiments attach) can be made, for example, from semiconductor materials, glass, or ceramics. In some instances, element 257 can have the same CTE as element 231. In such cases, for example, Cu to Cu joints are feasible as there is less concern about having a joint that can deform during shrinking of the two relative to each other. Holes, windows and angled edges can be readily formed if, for example, use plasma dicing is used (vs. blade dicing) (e.g. in FIG. 15) before grinding. One or more embodiments include micropads 232 on the die side for connecting die-to-die communications and to anchor to the substrate. One or more embodiments include Cu pillars 243, with or without solder, on the die side, which are 50 μm taller than the thickness of the substrate. Decoupling capacitors 235 can be located within or placed onto the substrate (either top or bottom depending upon the configuration). In addition to Cu pillars, the pillars could be Cu pillars with Ni caps. They can also be solders that are not reflowed, using, e.g., layers of Cu/Ni. Technically, Ni only pillars can be used, albeit requiring a long (in time duration) plating process.

One or more embodiments advantageously eliminate height differential among the various dies; enable an unlimited number of dies; avoid shorting concerns during chip joining; and/or enable multiple overhangs and combination of large windows and individual holes for each C4 Connection.

One or more embodiments provide a high bandwidth module with high density wiring for die-to-die communication with a mix of large window openings and small openings in order to accommodate passing through hundreds to thousands of C4s assembled at wafer level using heterogeneous integration; can support die(s) that cantilever(s) beyond the substrate or that is larger than the substrate but supports all corners; and/or enables addition of glass for high heat generating chips on the same substrate and for addition of microchannels or waveguides.

Indeed, one or more embodiments provide a solution to assemble multiple dies using Si technology within the limitations of a Si interposer. One or more embodiments enable for self-alignment with large openings for interconnects to pass through.

One or more embodiments provide a heterogeneous integration structure and a process of fabricating the same. Pertinent aspects include: 1) the method of fabricating low cost through silicon/glass/mold vertical interconnect access as opposed to expensive TSV, 2) Using dippable paste as opposed to conventional solder plating, which is helpful for bond and assembly.

One or more embodiments provide die-to-die connections in the horizontal plane, pillars for connection with a low-cost opening for the vertical connection, and/or use of dippable solder paste for final connection. One or more embodiments employ conventional low-cost connections which are formed on the active side of devices as compared to the side. Some embodiments allow a face to face connection with another piece of Si. In addition to the Si Decoupling Capacitors, the spacer could also have phase change memory or other memory within, enabling use for a graphics processing unit (GPU) and/or accelerator. In one or more embodiments, by underfilling pillars during the fabrication process, the pillars can then be recessed enough with a standard CMP and ashing process to allow the use of dippable solder paste. Indeed, in one or more embodiments, pillars are embedded in the underfill with their tips exposed for dippable solder paste. One or more embodiments are formed without using traditional stacked dies and/or plated through hole vias (such as in glass) for interconnections. One or more embodiments are formed without using wafer-to-wafer or PCB-to-PCB bonding (PCB=printed circuit board).

Given the discussion thus far, and referring, for example, to FIG. 19, it will be appreciated that an exemplary module, according to an aspect of the invention, includes a substrate 257 having a plurality of contact regions 258. Also included is a spacer-chip assembly, which in turn includes at least first and second semiconductor dies 241. Each die has a plurality of electrical interconnect pillars 243 and a plurality of contact pads 245. The spacer-chip assembly also includes a spacer wafer 231. The at least first and second semiconductor dies are secured to the spacer wafer. For example, the spacer wafer includes at least first and second semiconductor circuit features 235, such as decoupling capacitors, coupled to a first portion of the contact pads of the at least first and second semiconductor dies. The spacer wafer also includes wiring (e.g. high-density wiring 233) electrically coupling the at least first and second semiconductor dies via a second portion of the contact pads. The spacer wafer has a plurality of holes formed therethrough. The plurality of electrical interconnect pillars extend through the holes and are secured to the contact regions 258 on the substrate.

In addition to decoupling capacitors or other capacitors, features 235 can include a series of semiconductor based items that include, inductors, memory, phase change memory, and the like. The spacer is not limited to being a support entity. It can be used, for example, for GPU/accelerator applications, and the like.

One or more embodiments further include underfill 247 disposed in the holes. The holes are formed, for example, by opening the trenches 237 as described above, and are not separately numbered in FIG. 20. One or more embodiments further include over-mold 249 between the at least first and second semiconductor dies 241.

It is worth noting that in FIG. 19, element 257 can further include contact points (not shown) coupled to pillars 243 with pass-through holes and can also include land grid arrays (not shown) on the bottom that couple to a socket on a board (not shown). The board could have, for example, 4-8 of the modules shown in FIG. 19, for example. Applications include, for example, powerful mainframes such as the IBM Z15 mainframe. Such a system could have, for example, 4-8 drawers each containing a board.

As shown, for example, in FIG. 6, in some cases, the holes are sized to receive a single one of the pillars. On the other hand, as seen in FIG. 7, in some cases, the holes are sized to receive multiple ones of the pillars. In this latter case, for example, the pillars include under bump metallurgy (UBM).

Referring to FIGS. 32-34, some embodiments further include a glass-filled pocket formed in the spacer wafer 231 (note glass 273 in pocket 271). At least a portion of the holes are formed in the glass (see trenches 275). The first semiconductor die 277-1 includes a silicon chip, and the second semiconductor die 277-2 includes a silicon carbide chip. Those of the interconnect pillars 279 associated with the silicon carbide chip 277-2 extend into those of the holes in the glass.

Figure 26:
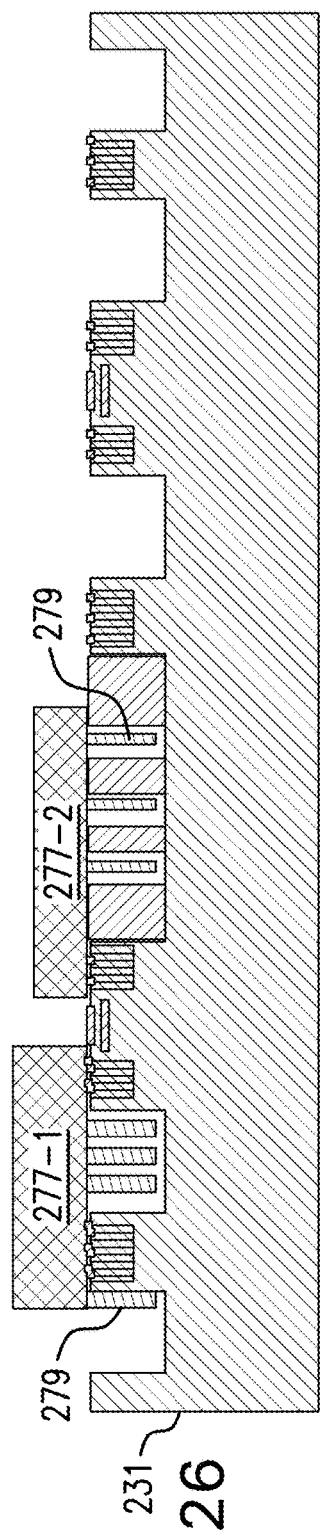

Referring to FIGS. 24-26, SiC runs very hot and other types of dies often cannot tolerate the heat. Glass 273 helps isolate the thermal load from SiC chip 277-2 from the rest of the structure. Referring to FIG. 26, SiC chip 277-2 has connection points (e.g. high density wiring discussed elsewhere) to conventional chip 277-1; these should be underfilled with a thermally nonconductive underfill, in one or more embodiments, so that heat from SiC chip 277-2 passes through its pillars 279 rather than laterally into chip 277-1. Where desired, cooling microchannels in glass 273 can be formed using various laser fabrication techniques that create channels within glass.

In some cases, the plurality of electrical interconnect pillars 243 are secured to contact regions on the substrate 257 via dippable paste 255.

In some instances, the plurality of electrical interconnect pillars 243 are secured to contact regions on the substrate via controlled collapse chip connection (C4) 265.

In some cases, the spacer wafer 231 includes glass and the decoupling capacitors 235 include thin film capacitors. In other cases, the spacer wafer 231 includes silicon and the decoupling capacitors 235 are selected from the group consisting of deep trench capacitors and MIM (Metal-Insulator-Metal) capacitors.

It will be appreciated that, advantageously, instead of creating a Si or glass interposer with TSV, in one or more embodiments, only the communication feature(s) and bumping of those regions with capture pads occur. In FIG. 19, for example, copper lines/wires in the Silicon under 249 include high-density wiring for die-to-die communication. Some pads connect to the capacitors, for example, while other pads can be provided just for anchoring, to hold the die to the spacer. It is worth noting that some prior art designs employ a silicon interposer with through-silicon vias running from top to bottom, with C4 connections on the bottom and micro-bumps on top. There is typically one TSV for each C4 bump, but there are many micro-bumps on top, more than the number of C4s, such that horizontal electrical wiring is required within the silicon interposer to connect to the micro-bumps. This requires undesirable redistribution layers within the Si interposer. Significant power may be carried in large C4s—say 4 kA/sq. cm. Advantageously, one or more embodiments do not require redistribution layers within silicon.

In another aspect, beginning at FIG. 8, it will be appreciated that an exemplary method, according to an aspect of the invention, includes the step of providing a spacer wafer 231. The spacer wafer has inner 234 and outer 236 surfaces, and the spacer wafer includes at least first and second semiconductor circuit features 235 and high-density wiring 233, adjacent the outer surface 236. A further step, as seen in FIG. 9, includes forming a plurality of trenches 237 partially through the spacer wafer, spaced from the at least first and second semiconductor circuit features and the high-density wiring. Referring to FIGS. 10 and 11, a further step includes providing first and second semiconductor dies 241, each having a plurality of electrical interconnect pillars 243 and a plurality of contact pads 245. The electrical interconnect pillars have distal ends (the downward-pointing ends, not the ends attached to the die 241. A still further step includes securing the first and second semiconductor dies 241 to the spacer wafer 231 via the plurality of contact pads 245 with the interconnect pillars 243 extending into the trenches 237, and with the contact pads 245 coupled to the high-density wiring 233 and the semiconductor circuit features (e.g. decoupling capacitors 235), to form a spacer-chip assembly. High-density wiring can include, for example, wiring such as used in semiconductor fabrication processes that can go from 5 µm lines and spaces to sub-micron lines and spaces.

Referring to FIG. 16, an even further step includes processing the inner surface 234 of the of the spacer wafer 231 to open the trenches and expose the distal ends of the pillars 243. As seen in FIG. 18, yet a further step includes applying electrically conductive connective material (e.g. dippable paste 255 of C4) to the distal ends of the pillars. A still further step, as seen in FIG. 19, includes securing the spacer-chip assembly to a substrate 257 via the dippable paste on the distal ends of the pillars.

As seen in FIG. 12, one or more embodiments further include applying underfill material 247 into the trenches subsequent to the securing. Further, as seen in FIG. 13, one or more embodiments still further include applying over-molding 249 over and between the first and second semiconductor dies after applying the underfill.

As seen in FIG. 14, one or more embodiments further include processing (e.g. grinding) the over-molding to render it flush with outer surfaces 248 of the semiconductor dies 241. This process enables removing just a little of the back of the die such as a few microns to as thin as desired such as over 685 µm for a 785 µm die. One purpose is to ensure there is no over-mold material on the back of the die so as to ensure successful thermal flux from the back. It is also desirable to have all of the dies within the same plane for successful lid contact. One or more embodiments use RIE to back some of the over-mold to ensure it does not interfere with the lid capping operation.

As seen in FIG. 12, in one or more embodiments, the providing further includes providing third and fourth semiconductor dies 241, each having a plurality of electrical interconnect pillars 243 and a plurality of contact pads 245. In such instances, the securing further includes securing the third and fourth semiconductor dies to the spacer wafer via the plurality of contact pads with the interconnect pillars extending into the trenches, and with the contact pads coupled to the high-density wiring, to form the spacer-chip assembly. A further step includes singulating the spacer wafer to form a first module 253 including the first and second semiconductor dies and a second module 253 including the third and fourth semiconductor dies.

In a non-limiting example, singulating includes partially dicing the spacer-chip assembly as seen in FIG. 16 by forming cuts 251 from the outside into the spacer wafer, prior to processing the inner surface. the processing of the inner surface of the spacer wafer effectuates the singulating via contacting the cuts as seen in FIG. 17.

In FIG. 16, one or more embodiments grind down to just before the distal tips of the pillars 243 are reached. An IR-detectable (e.g. metal) feature 242 can be included in the silicon, and an IR (infrared) sensor can be employed. This sensor does not "see" silicon but "sees" the metal feature 242. For example, grind about 10 μm before hitting the underfill region. The carry out CMP (chemical-mechanical planarization) using slurry-impregnated fabric, followed by reactive ion etch (ME) to preferentially remove material 231 without removing material from pillars 243, and ash back until the pillars are exposed by the desired amount as in FIG. 16.

In an alternative approach not using dice-before-grind (suitable, for example, for applications not using copper paste), expose the TSVs by about 10 microns, deposit a nitride-oxide-nitride tri-layer, open the TSVs only in the desired region, sputter, apply photoresist, plate up a large C4, and connect to the substrate.

Referring to FIGS. 24-26, one or more embodiments further include forming a pocket 271 in the spacer wafer 231; and adhering glass 273 into the pocket. the forming of the plurality of trenches includes forming at least a portion of the trenches 275 in the glass. The first semiconductor die 277-1 includes a silicon chip and the second semiconductor die 277-2 includes a silicon carbide chip. In the step of securing the first and second semiconductor dies to the spacer wafer via the plurality of contact pads with the interconnect pillars extending into the trenches, those of the interconnect pillars 279 associated with the silicon carbide chip 277-2 extend into those of the trenches 275 in the glass 273. In some embodiments, all the pillars 279 emanating from the chip 277-2 pass through holes in the glass. Some pillars 279 emanating from SiC chip 277-2 will be carrying significant power and can be made with a larger diameter than the pillars 279 emanating from chip 277-1. For example, die 277-1 (not SiC, for example) could be on the order of 20×25 mm viewed in plan and could dissipate about 600 W, while a similarly-dimensioned SiC die 277-2 might dissipate 1200 W or more. There can also be signal input/output (I/O) connections to chip 277-2 that do not dissipate significant power. A scheme such as in FIG. 7 could be employed with pillars of different diameters depending on the power dissipation. The low-power smaller-diameter pillars 279 could bypass the glass 273 if desired.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   providing a spacer wafer, said spacer wafer having inner and outer surfaces, said spacer wafer including at least first and second semiconductor circuit features and wiring, adjacent said outer surface;
   forming a plurality of trenches partially through said spacer wafer, spaced from said at least first and second semiconductor circuit features and said wiring;
   providing first and second semiconductor dies, each having a plurality of electrical interconnect pillars and a plurality of contact pads, said electrical interconnect pillars having distal ends;
   securing said first and second semiconductor dies to said spacer wafer via said plurality of contact pads with said interconnect pillars extending into said trenches, and with said contact pads coupled to said wiring and said semiconductor circuit features, to form a spacer-chip assembly;
   processing said inner surface of said of said spacer wafer to open said trenches and expose said distal ends of said pillars;
   applying electrically conductive connective material to said distal ends of said pillars; and
   securing said spacer-chip assembly to a substrate via said electrically conductive connective material on said distal ends of said pillars.

2. The method of claim 1, wherein applying said electrically conductive connective material comprises applying dippable paste.

3. The method of claim 2, wherein said semiconductor circuit features comprise decoupling capacitors.

4. The method of claim 3, further comprising applying underfill material into said trenches subsequent to said securing.

5. The method of claim 4, further comprising applying over-molding over and between said first and second semiconductor dies after applying said underfill.

6. The method of claim 5, further comprising processing said over-molding to render it flush with outer surfaces of said semiconductor dies.

7. The method of claim 6, wherein:
   said providing further comprises providing third and fourth semiconductor dies, each having a plurality of electrical interconnect pillars and a plurality of contact pads;
   said securing further comprises securing said third and fourth semiconductor dies to said spacer wafer via said plurality of contact pads with said interconnect pillars extending into said trenches, and with said contact pads coupled to said wiring, to form said spacer-chip assembly;
   further comprising singulating said spacer wafer to form a first module including said first and second semiconductor dies and a second module including said third and fourth semiconductor dies.

8. The method of claim 7, further comprising partially dicing said spacer-chip assembly by forming cuts from outside into said spacer wafer, prior to processing said inner surface, wherein said processing of said inner surface of said spacer wafer effectuates said singulating via contacting said cuts.

9. The method of claim 8, wherein said partial dicing comprises plasma dicing.

10. The method of claim 5, further comprising:
    forming a pocket in said spacer wafer; and
    adhering glass into said pocket;
    wherein:
        said forming of said plurality of trenches includes forming at least a portion of said trenches in said glass;
        said first semiconductor die comprises a silicon chip;
        said second semiconductor die comprises a silicon carbide chip; and
        in said step of securing said first and second semiconductor dies to said spacer wafer via said plurality of contact pads with said interconnect pillars extending into said trenches, at least a portion of those of said interconnect pillars associated with said silicon carbide chip extend into those of said trenches in said glass.

11. The method of claim 1, wherein applying said electrically conductive connective material comprises applying controlled collapse chip connection (C4) solder blobs.

\* \* \* \* \*